(12) United States Patent
Chan et al.

(10) Patent No.: US 6,286,747 B1
(45) Date of Patent: Sep. 11, 2001

(54) ULTRASONIC TRANSDUCER

(75) Inventors: Helen Lai Wa Chan; Siu Wing Or; Chung Loong Choy, all of Kowloon (HK)

(73) Assignee: Hong Kong Polytechnic University, Kowloon (HK)

( * ) Notice: Subject to any disclaimer, the term of this patent is extended or adjusted under 35 U.S.C. 154(b) by 0 days.

(21) Appl. No.: 09/533,786

(22) Filed: Mar. 24, 2000

(51) Int. Cl.[7] ............................. B23K 1/06; B23K 20/10
(52) U.S. Cl. .................. 228/1.1; 228/110.1; 156/73.1; 156/580.1; 310/311
(58) Field of Search ................... 228/1.1, 110.1, 228/4.5, 180.5; 156/73.1, 73.2, 580.1, 580.2; 310/311

(56) References Cited

U.S. PATENT DOCUMENTS

| | | |
|---|---|---|
| 3,595,069 | 7/1971 | Fowler . |
| 4,040,885 | 8/1977 | Hight et al. . |
| 4,523,121 * | 6/1985 | Takahashi et al. . |
| 4,582,240 * | 4/1986 | Lux et al. . |
| 4,701,659 * | 10/1987 | Fujii et al. . |
| 4,735,096 | 4/1988 | Dorr . |
| 4,854,494 | 8/1989 | von Raben . |
| 4,858,470 | 8/1989 | Kincaid et al. . |
| 5,314,105 | 5/1994 | Farassat . |
| 5,325,012 * | 6/1994 | Sato et al. . |
| 5,329,496 * | 7/1994 | Smith . |
| 5,357,423 | 10/1994 | Weaver et al. . |
| 5,364,005 * | 11/1994 | Whelan et al. . |
| 5,376,858 * | 12/1994 | Imabayashi et al. . |
| 5,377,894 | 1/1995 | Mizoguchi et al. . |
| 5,469,011 * | 11/1995 | Safabakhsh . |
| 5,540,807 | 7/1996 | Akike et al. . |
| 5,603,445 * | 2/1997 | Hill et al. . |
| 5,748,566 | 5/1998 | Goodson . |
| 5,816,476 * | 10/1998 | Buice et al. . |
| 6,078,125 * | 6/2000 | Roberts . |
| 6,088,894 * | 7/2000 | Oakley et al. . |
| 6,190,497 * | 2/2001 | Chan et al. . |

\* cited by examiner

Primary Examiner—Tom Dunn
Assistant Examiner—Kiley Stoner
(74) Attorney, Agent, or Firm—Leydig, Voit & Mayer, Ltd.

(57) ABSTRACT

A bonding tool has a driver of piezoelectric elements in a stack. A sensor is positioned and held in the stack and includes a piezoelectric element sandwiched between electrodes and insulating wafers. Voltage developed between the electrodes is monitored and used to determine a bonding parameter, including the amplitude and duration of each ultrasonic burst.

5 Claims, 6 Drawing Sheets

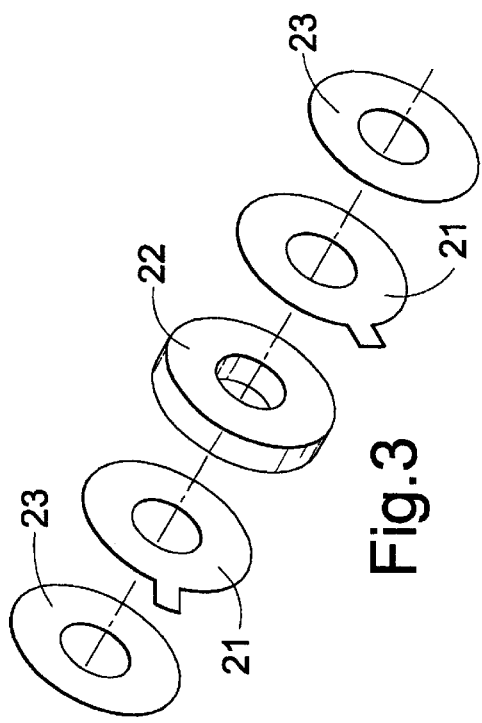
Fig. 3
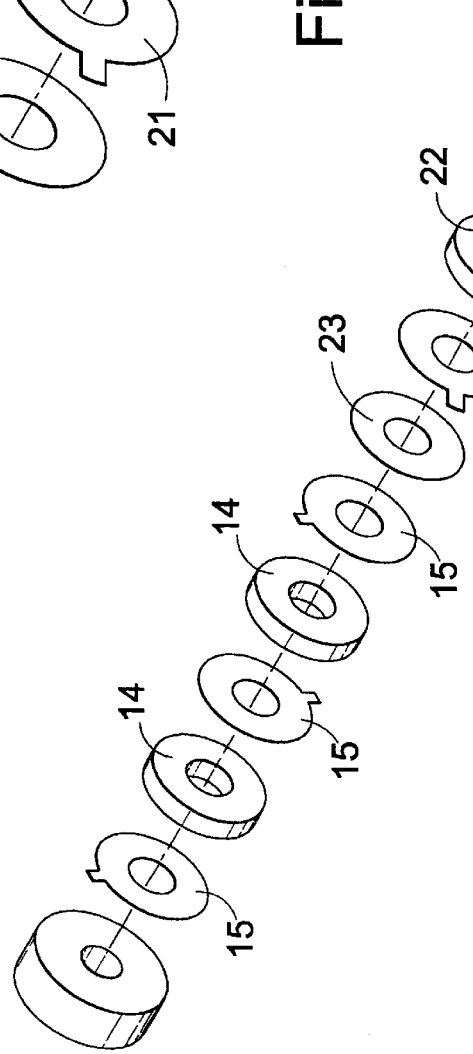
Fig. 4
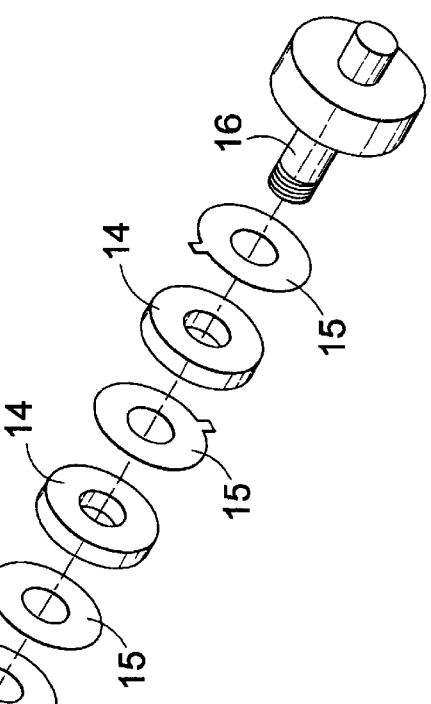

ULTRASONIC TRANSDUCER

BACKGROUND OF THE INVENTION

1. Field of the Invention

The invention relates to ultrasonic transducers.

2. Description of Prior Art

The invention relates more particularly to such transducers for use in bonding tools for connecting semiconductors to printed circuit boards for example. The bonding tools are used to apply pressure and ultrasonic energy simultaneously to miniature components for making electrical connections between them. The materials used in the driver of the ultrasonic transducers are piezoelectric ceramics. In different stages in the bonding process, there are parameters that must be monitored including the amplitude of the ultrasonic burst and its duration (bonding time). An optimized range of these bonding parameters which ensures the required bond quality is usually determined for each type of bonding machine. At present, all the bond parameter monitoring sensors are installed separated from the piezoelectric driver or may be attached to the ultrasonic concentrator.

SUMMARY OF THE INVENTION

It is an object of the invention to overcome or at least reduce this problem.

According to the invention there is provided a bonding tool for applying pressure and ultrasonic energy simultaneously to join miniature components together, the bonding tool comprising an ultrasonic driver having a plurality of thin piezoelectric wafers separated by planar electrodes and held together in a stack under mechanical pressure against one another, and a sensor mounted in the stack that comprises a pair of planar sensor electrodes separated by a piezoelectric wafer and insulated from adjacent electrodes in the stack, and means for measuring electrical voltages generated across the sensor electrodes.

Two or more sensors may be positioned in the stack.

The piezoelectric wafers are preferably cylindrical.

The piezoelectric wafer of the sensor may be made of one of a polymer, ceramic and composite material.

Each of the sensor electrodes may be made up of a plurality of conductive elements that are separately connectable electrically to the measuring means.

BRIEF DESCRIPTION OF THE DRAWING

Bonding tools according to the invention will now be described by way of example with reference to the accompanying drawings in which:

FIG. 3 is an exploded isometric view of sensor components for a sensor according to the present invention;

FIG. 4 is an exploded isometric view of a bonding tool according to the present invention;

DESCRIPTION OF THE PREFERRED EMBODIMENTS

Figure 1:
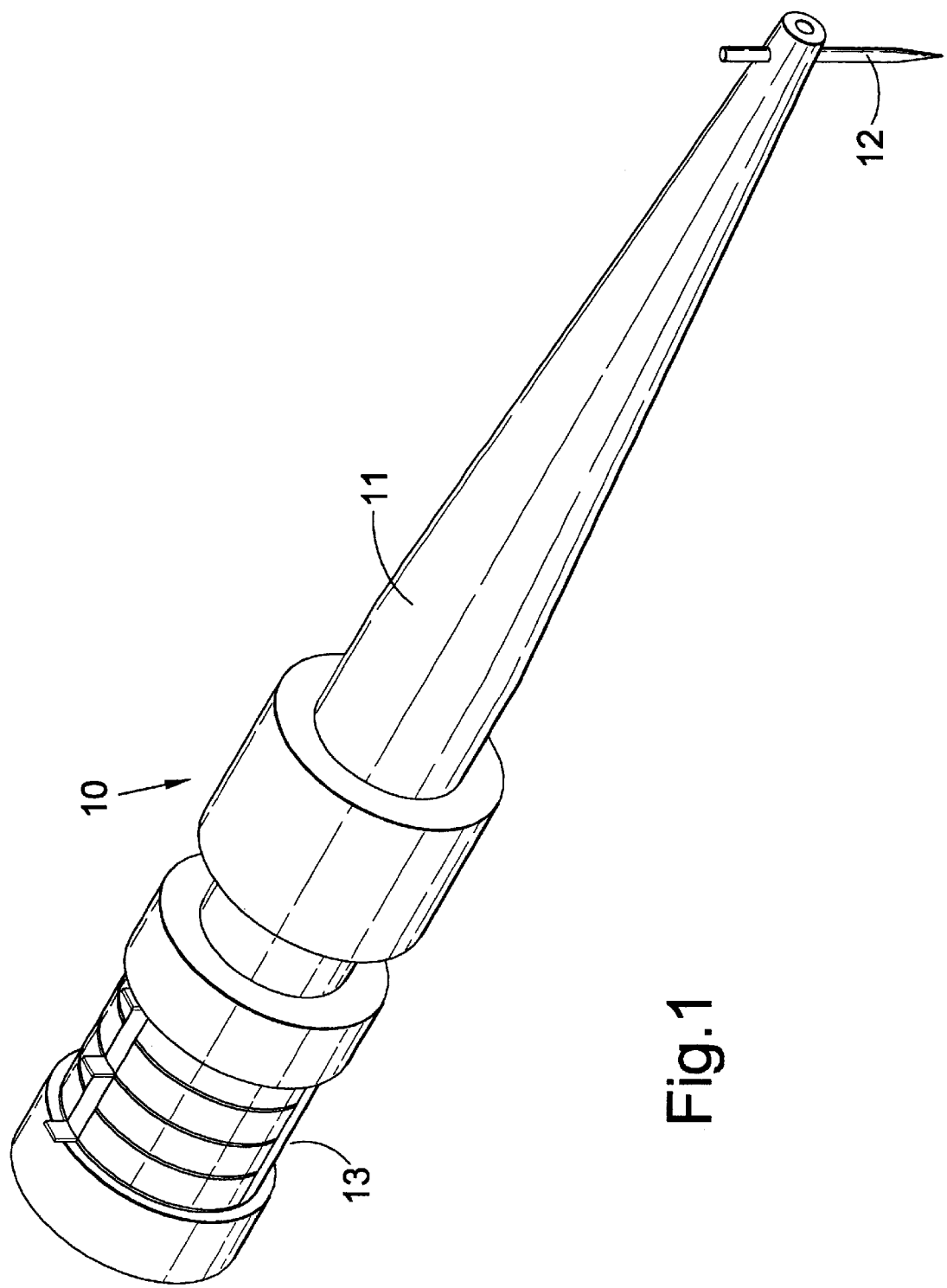
FIG. 1 is an isometric view of a known bonding tool.
Figure 2:
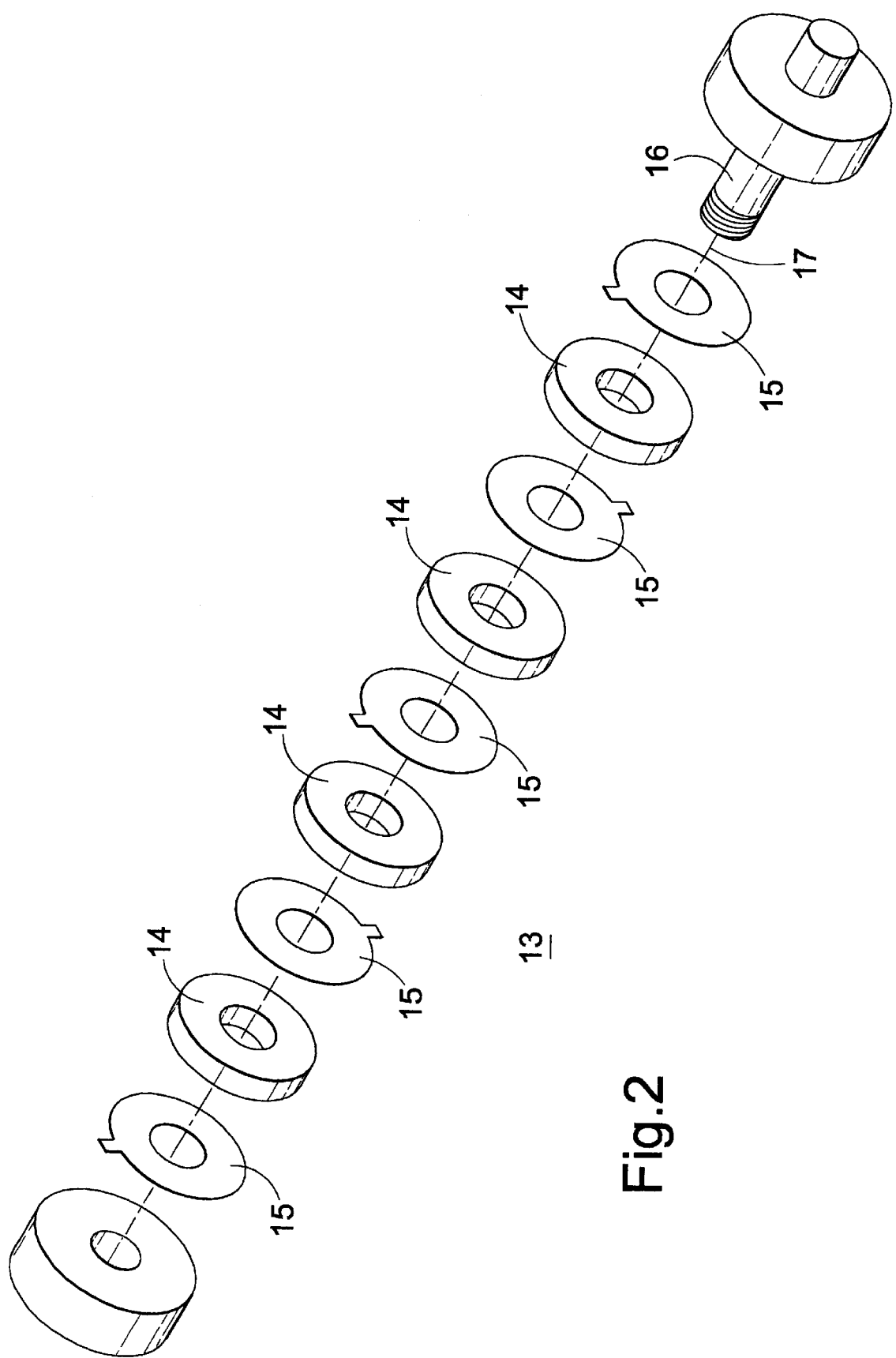
FIG. 2 is an exploded isometric view of an ultrasonic driver for the bonding tool of FIG. 1.

Referring to the drawings, in FIGS. 1 and 2 the known bonding tool comprises a barrel 10 and an elongate horn or ultrasonic concentrator 11. A sharply pointed wedge 12, attached adjacent a remote end of the horn 11, is used in practice to direct pressure and ultrasonic energy to miniature components, typically a thin wire to a micro-electric substrate, that are to be mechanically joined together. An ultrasonic driver 13 includes four cylindrical ceramic wafers 14 separated by disk electrodes 15 to which an alternating current power supply can be connected. The wafers 14 are held on a threaded shaft 16 (see FIG. 2) and against one another by a nut (not shown). The nut is tightened in practice such that the wafers 14 always remain in compression during operation of the tool. The tool so far described is well-known and has been widely used in practice.

In order to monitor the performance of the bonding tool in use a sensor is incorporated into the driver of the bonding tool. In FIG. 3, sensor components are shown and comprise two wafer electrodes 21 mounted on either side of a piezoelectric wafer 22. The wafer 22 may be any suitable piezoelectric material including a polymer, a ceramic and composite materials. Insulating wafers 23 are mounted on either side of the electrodes 21. The sensor is sandwiched centrally in the stack that normally makes up the ultrasonic driver 14 (see FIG. 4). Electric wires are connected in use to the electrodes 21 to monitor voltages developed across the wafer 22. This enables bonding processes to be monitored during use of the bonding tool.

Figure 5:
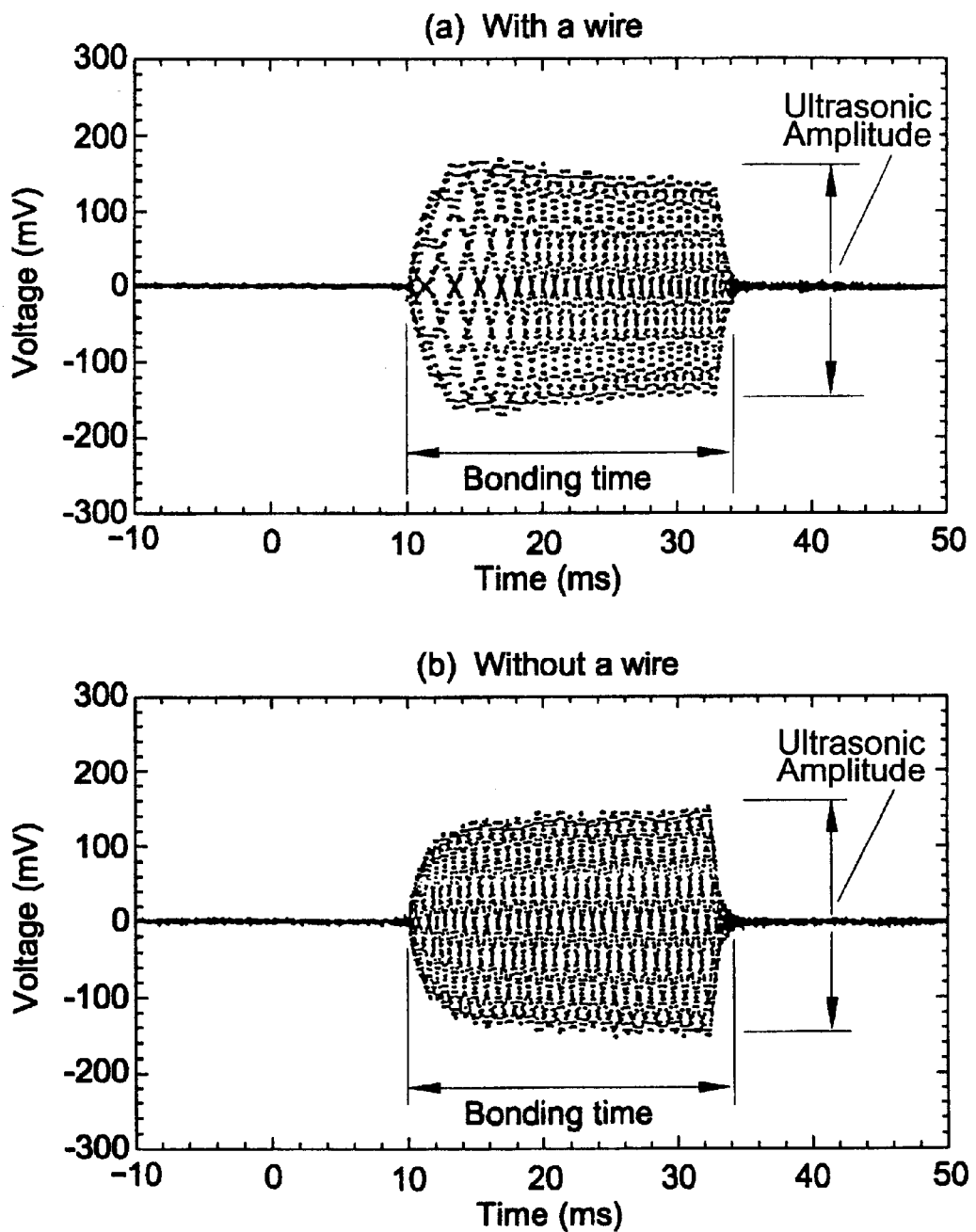
FIG. 5 shows graphs of outputs of such sensors.

In different stages in the bonding process, there are parameters that should be monitored including the amplitude of the ultrasonic burst and its duration (bonding time), see FIG. 5.

It will be noted, for example that the graphs in FIG. 5 show the bonding parameters when a wire is present and when a wire is not present. Thus, the lower graph immediately indicates to an operator, or automatically, in a production environment that a wire is not present. In other words, a wire connection has not been made because a wire feed or a wire positioning operation has failed so that the wire end has not been bonded to a miniature component surface. Bonding operation must be arrested and the problem solved before re-commencing the production process.

Figure 6:
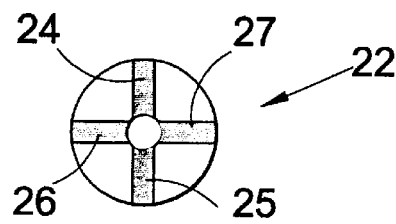
FIG. 6 is a plan view of a form of an electrode that can be used for the sensor.

It is possible to form the electrode 21 with a number of conductive electrode elements such as shown in FIG. 6. For example, electrode elements 24 and 25 are disposed vertically with respect to the bonding tool (that is, parallel to the longitudinal axis of the wedge 12) and elements 26 and 27 are disposed horizontally. Electrical voltages developed between the electrode elements can be monitored and graphs similar to those shown in FIG. 5 provided. Different aspects or bonding parameters can be illustrated in this way.

Voltages developed at the vertical elements 24 and 25 are more responsive to bending moments in the bonding tool caused when the wedge 12 is pressed against a wire and urged against a contact pad on the microelectric component, for example. Thus, the "output" derived from the elements 24 and 25 can be used to detect the bonding force. The "output" derived from the elements 24 and 25 is virtually unaffected by the bonding force and therefore provides a better or more reliable measure of the ultrasonic burst and the duration of that burst.

Figure 7:
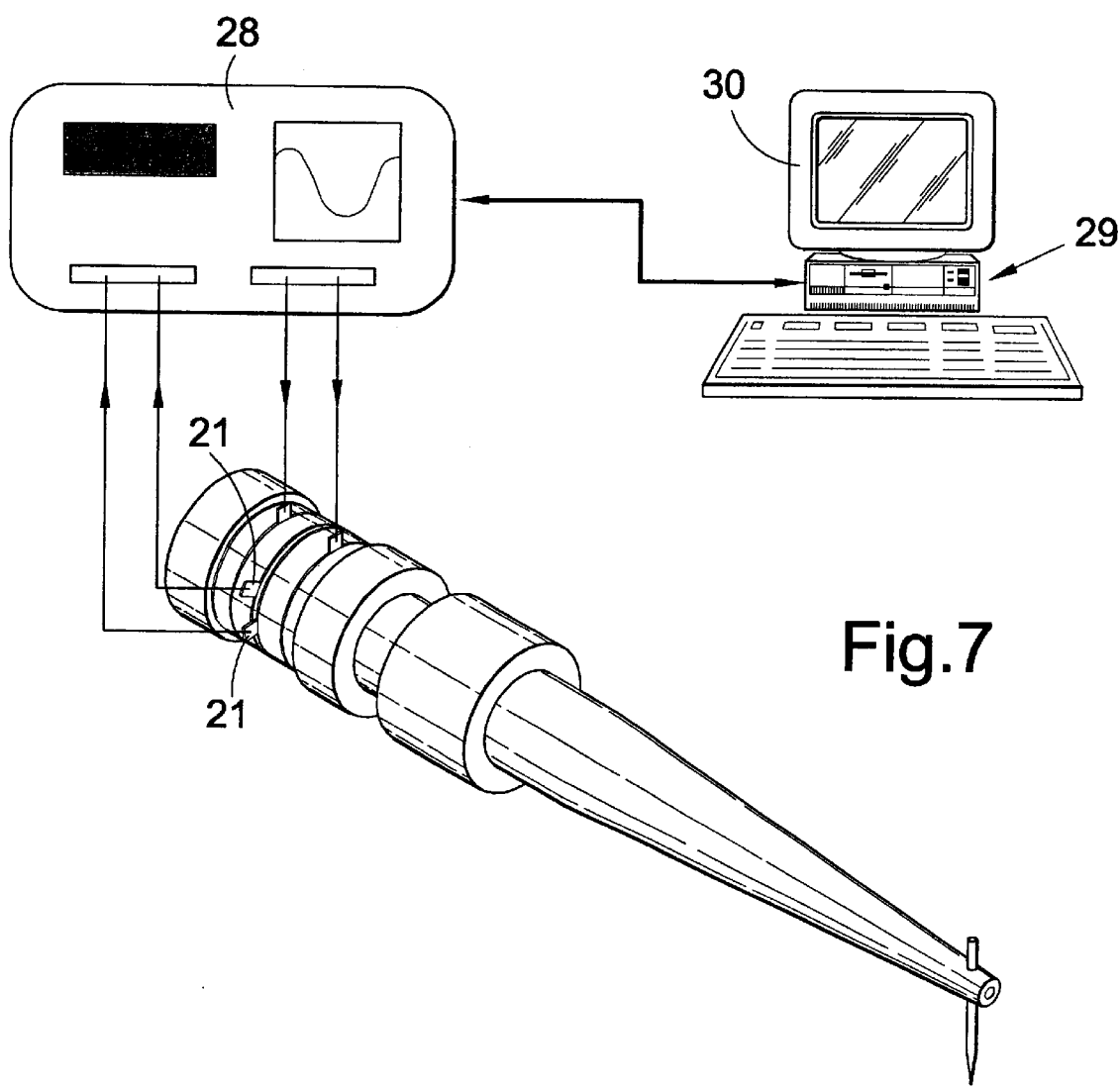
FIG. 7 is a schematic view of a sensor application station using sensors of the present invention.

A practical work station for monitoring and recording bonding parameters is shown in FIG. 7. A power supply unit 28 is provided for the bonding tool 11. Sensor electrodes 21 are connected by wires to the unit 28 to monitor and record dynamic parameters of the bonding operations. The parameters are processed using a personal computer 29 and the graph shown in FIG. 5 displayed on a TV monitor 30.

It will be appreciated that it is possible where required to have two or more sensors mounted in the ultrasonic driver 14 along its length. However, the sensor must normally be positioned so that electrical symmetry of the "active" piezoelectric driver wafers 14 is maintained. These piezoelectric wafers are connected electrically in adjacent pairs along the length of the driver so that the sensor can only be positioned between or at one side of such pairs. Also, the sensor components must be positioned so that the balance or centre of gravity of the bonding tool is not disturbed. This is because the bonding tool is required to provide mechanical vibrations in use and so its overall balance is normally carefully designed for this reason. It is nevertheless possible to position the sensor at one end of the driver and incorporate a dummy or balancing inactive set of components or the like at the other end of the driver so that an overall desired balance is maintained.

Figure 8:
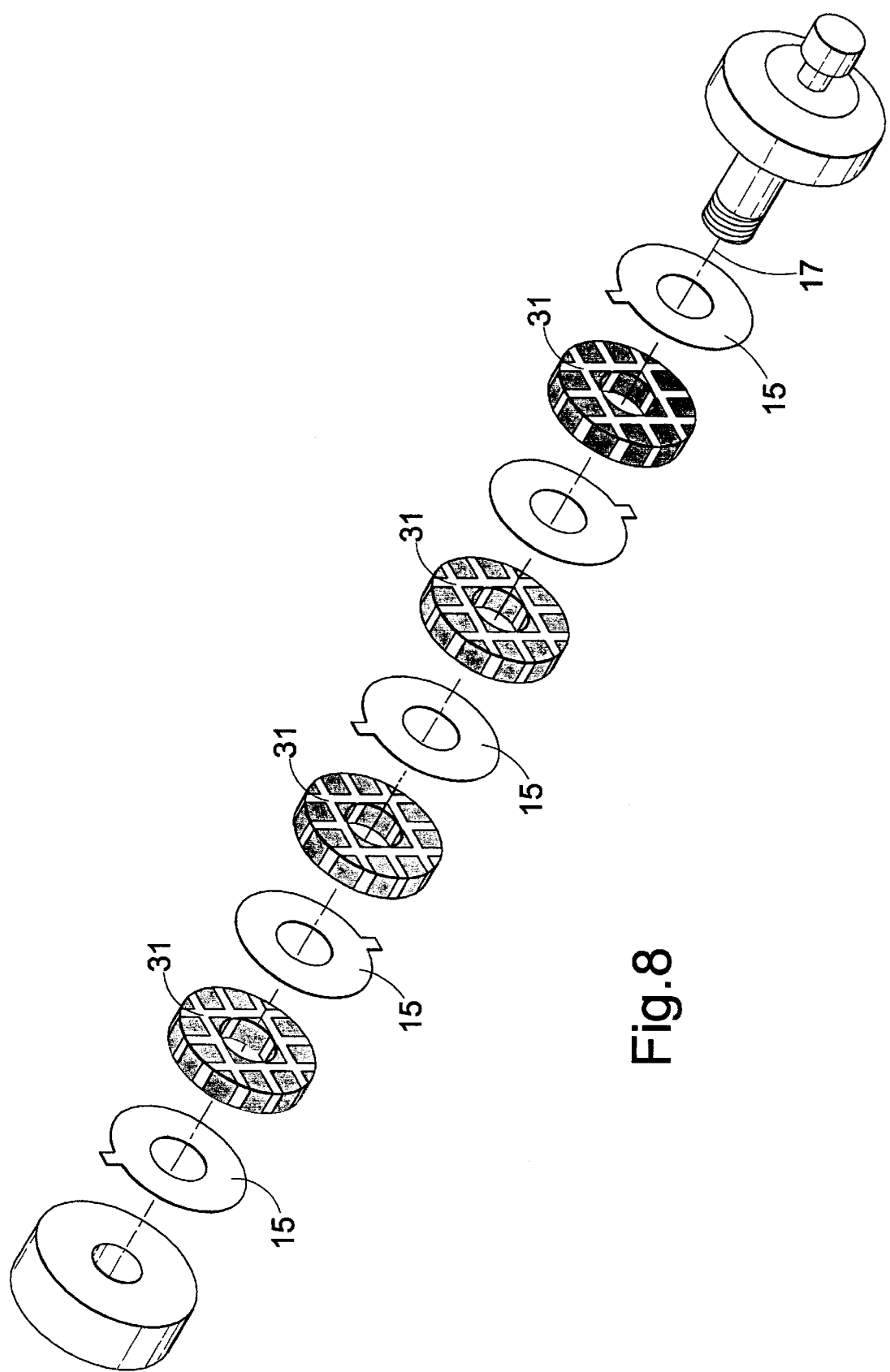
FIG. 8 is an exploded view of an ultrasonic driver of another bonding tool.

The ceramic transducers have sharp resonances and high "Q". Within the narrow bandwidth of operation, coupling of different resonance modes causes a loss of energy to unwanted modes of vibration and reduces the efficiency as well as the stability of the transducer. In FIG. 8, another ultrasonic driver for a bonding tool has four ceramic/polymer composite wafers 31 that replace the wafers 14 (of FIG. 2). Otherwise the ultrasonic driver is the same as shown in FIG. 2. It will be seen that each composite wafer is made up of a number of parts of ceramic material that are separated from one another by layers of polymer material. These thin layers of polymer extend in planes that are parallel to the minor axes or a longitudinal central axis of each wafer 17 and serve to suppress vibrations in unwanted modes. The planes for the layers of each wafer are aligned with like planes in adjacent wafers. A suitable polymer is made up of LW5157 resin and HY5159 hardener, available from Ciba Specialty Chemicals Limited. A bonding transducer incorporating composite wafers as described exhibits a clean and wider bandwidth resonance mode at operation frequency, thus minimising mode coupling and providing improved transducer stability.

Ultrasonic drivers for bonding tools can be made up of combinations of composite wafers. In each case, sensors, as shown in FIG. 3, can be mounted within the driver of FIG. 8, centrally or otherwise as explained above, to enable the bonding parameters of the driver of FIG. 8 to be monitored as desired in the same manner as the driver shown in FIG. 4.

Whereas all the described composite wafers are cylindrical, embodiments of the invention can be provided with other shaped composite wafers including irregular and rectangular cross-sectioned uniform or composite wafers.

We claim:

1. A bonding tool for applying pressure and ultrasonic energy simultaneously to join miniature components together, the bonding tool comprising:

an ultrasonic driver having a plurality of thin piezoelectric wafers separated by planar electrodes and held together in an stack against one another under mechanical pressure, a sensor mounted in the stack and comprising a pair of planar sensor electrodes separated by a piezoelectric wafer and insulated from adjacent electrodes in the stack, and means for measuring electrical voltages generated across the sensor electrodes.

2. The bonding tool according to claim 1, including at least two sensors positioned in the stack.

3. The bonding tool according to claim 1, wherein the piezoelectric wafers are cylindrical.

4. The bonding tool according to claim 1, wherein the piezoelectric wafer of the sensor is one of a polymer, a ceramic, and a composite material.

5. The bonding tool according to claim 1, in which the sensor electrode includes a plurality of conductive elements that are separately electrically connectable to the measuring means.

* * * * *